United States Patent
Aoyama et al.

(10) Patent No.: US 7,240,307 B2
(45) Date of Patent: Jul. 3, 2007

(54) PATTERN SIZE CORRECTING DEVICE AND PATTERN SIZE CORRECTING METHOD

(75) Inventors: Hajime Aoyama, Kawasaki (JP); Morimi Osawa, Kawasaki (JP); Teruyoshi Yao, Kawasaki (JP); Kozo Ogino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 110 days.

(21) Appl. No.: 11/041,216

(22) Filed: Jan. 25, 2005

(65) Prior Publication Data
US 2005/0121628 A1 Jun. 9, 2005

Related U.S. Application Data

(63) Continuation of application No. PCT/JP03/04616, filed on Apr. 11, 2003.

(30) Foreign Application Priority Data

| Jul. 31, 2002 | (JP) | ............................. 2002-224036 |
| Nov. 6, 2002 | (JP) | ............................. 2002-322899 |

(51) Int. Cl.
*G06F 17/50* (2006.01)
(52) U.S. Cl. ............................. 716/4; 716/19; 716/21
(58) Field of Classification Search ................ 716/4–5, 716/19, 21
See application file for complete search history.

(56) References Cited

U.S. PATENT DOCUMENTS

| 5,403,088 A * | 4/1995 | Killmer et al. ............. 366/102 |
| 6,226,034 B1 * | 5/2001 | Katayama ................... 348/242 |
| 6,281,513 B1 * | 8/2001 | Takenaka ............... 250/492.22 |
| 6,436,607 B1 * | 8/2002 | Lozes et al. ................ 430/296 |
| 6,610,989 B1 | 8/2003 | Takahashi |
| 6,677,089 B2 | 1/2004 | Ogino et al. |
| 2001/0028983 A1 * | 10/2001 | Kawamura et al. ............ 430/5 |
| 2002/0036273 A1 * | 3/2002 | Okino ..................... 250/491.1 |
| 2003/0048458 A1 * | 3/2003 | Mieher et al. .............. 356/601 |

FOREIGN PATENT DOCUMENTS

| JP | 10-10701 | 1/1998 |
| JP | 11-102062 | 4/1999 |
| JP | 2000-75467 | 3/2000 |
| JP | 2000-323377 | 11/2000 |
| JP | 2003-100624 | 4/2003 |

OTHER PUBLICATIONS

Tae Moon Jeong et al., *Flare in Microlithographic Exposure Tools*, Japanese Journal of Applied Physics, vol. 41, No. 8, Aug. 2002.

* cited by examiner

*Primary Examiner*—Paul Dinh
*Assistant Examiner*—Suresh Memula
(74) *Attorney, Agent, or Firm*—Westerman, Hattori, Daniels & Adrian, LLP.

(57) ABSTRACT

A pattern size correcting device includes: a testing photomask (1) having a test pattern; a quantifying unit (2) that quantifies, using the testing photomask (1), size variation in the test pattern as a function of distance and in relation to an open area ratio; an open area ratio calculating unit (3) that divides an exposure area having a plurality of actual device patterns into a plurality of correction areas and calculates the open area ratio of the respective correction areas; a data correcting unit (4) that inputs the open area ratio calculated by the open area ratio calculating unit (3) into a result of the quantification that uses the photomask (1), calculates size variations of the actual device patterns in the respective correction areas, and corrects design data of the actual device patterns based on the calculation; and a proximity effect correcting unit correcting a proximity effect. This correcting device enables quantitative estimation of size variation occurring in a pattern exposed in lithography and easy and accurate correction of pattern size based on the estimation.

36 Claims, 13 Drawing Sheets

MEASUREMENT EXAMPLE OF HOLE PATTERN
(HOLE:140nm, PITCH 280nm)

PATTERN SIZE CORRECTING DEVICE

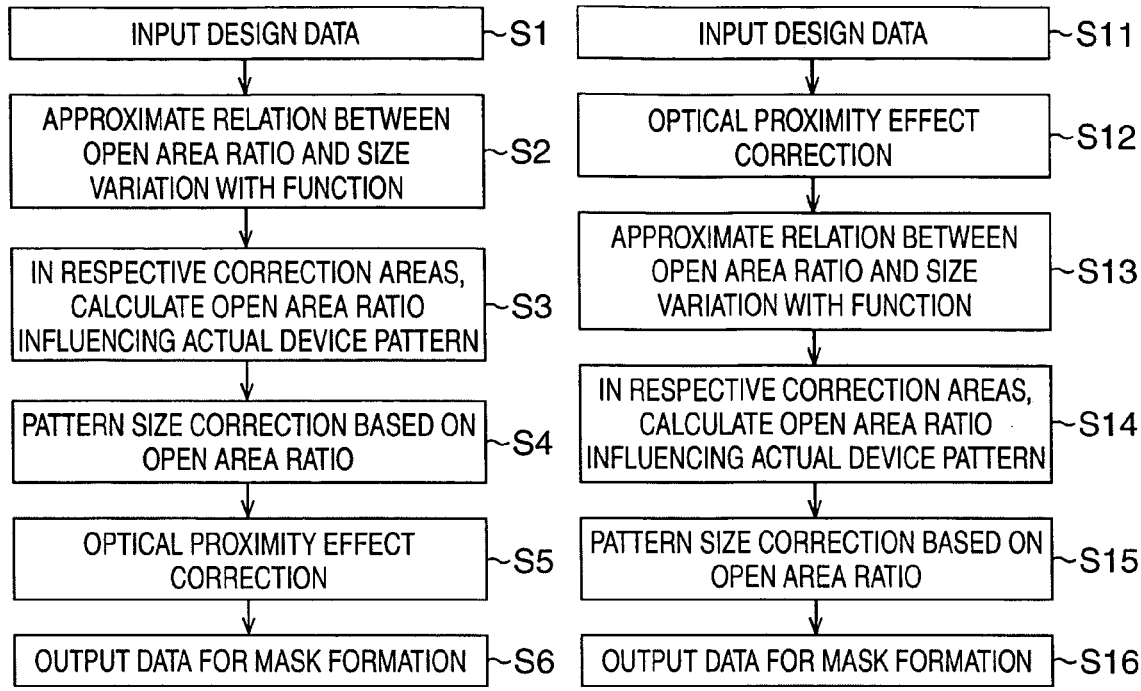

22 TEST PATTERN
31 FLARE GENERATING PATTERN
BELT WIDTH 2.7μm

32 TESTING PATTERN
33 FLARE GENERATING PATTERN
23 TEST PATTERN

34 TESTING PATTERN
35 FLARE GENERATING PATTERN
24 TEST PATTERN

36 TESTING PATTERN
37 FLARE GENERATING PATTERN
25 TEST PATTERN

EXPLANATORY CHART OF ENTERING INFLUENCE FROM ADJACENT
CORRECTION AREAS IN PATTERN DENSITY METHOD

RELATION BETWEEN OPEN AREA RATIO AND SIZE AFTER
CORRECTION WHEN $\beta F$ VALUE IS VARIED

CONCEPTUAL CHART OF APPROXIMATION
WITH TRAPEZOIDAL WAVE

PATTERN SIZE CORRECTING DEVICE AND PATTERN SIZE CORRECTING METHOD

This application is a continuation of international application PCT/JP03/04616 filed on Apr. 11, 2003.

TECHNICAL FIELD

The present invention relates to a pattern size correcting device and a pattern size correcting method for correcting the size of a device pattern formed in a lithography process which is one of the manufacturing processes of a semiconductor device, and is suitably applied to various kinds of devices, for example, semiconductor chips such as IC and LSI, display elements such as a liquid crystal panel, detecting elements such as a magnetic head, imaging elements such as CCD, and so on.

BACKGROUND ART

In a pattern forming technology, manufacturing of semiconductor devices using photolithography is in practice. The photolithography is a method of forming a desired pattern on a reticle being a photomask and transferring the pattern on a sample substrate via a reduction optical system. Photosensitive resin called a resist is formed on the sample substrate, and making use of a difference, between an exposed portion and an unexposed portion, in dissolving rate in a developing solution, a latent image of the transferred pattern is developed to form a pattern, and then etching follows, so that a material can be processed as desired.

In an exposure technology, in order to precisely transfer a microscopic pattern, the influence of proximate patterns is calculated and determined for correction, in addition to optimizing the wavelength of exposure light and a reticle structure. This correction is called OPC (Optical Proximity Correction), and a correction amount of a transferred image of the pattern is calculated based on the influence of an optical proximity effect obtained by calculation or by an experiment, considering lighting conditions (NA, Sigma), exposure conditions (a material of the resist, exposure wavelength) and so on of a stepper, thereby correcting the reticle size.

However, there is a factor uncorrectable by OPC, for example, size difference in scarce and dense patterns that is caused by flare of the stepper or at the time of etching, and the size of the formed patterns varies. The flare of the stepper is generated by minute irregularities of a lens or variation in refractive index of a lens, or by reflected and scattered light on a wafer surface. Further, local occurrence of flare depending on the condition of a surrounding area of each pattern has recently been recognized as a problem. This is a so-called local flare, and it is caused by peculiarity of a material of the lens depending on the wavelength (short wavelength of, typically, 193 nm) of the exposure light used and is a major factor of causing an unexpected change in shape and line width of the transferred pattern. Further, in etching, a region having a large etched area runs short of reaction gas or has increased reactive products, which causes precision deterioration of pattern formation depending on the area or the size in some region.

However, precise correction of such size variation caused by the local flare of the stepper and the loading effect in etching is difficult.

The above-described local flare should be quantified and eliminated in order to accurately form desired patterns in a semiconductor device, but this is a problem which has drawn attention just recently as described above, and therefore, currently no suitable technique of intentionally solving this specific problem of the local flare has been devised.

Further, in the optical proximity effect correction, the optical proximity effect is calculated based on patterns in a region within several μm, but time restriction makes it difficult to widen a calculation range to several ten μm as is required for the calculation of the influence of the flare, and it has been difficult to explain the influence of flare by the proximity effect of light intensity. Moreover, the influence of the loading effect in etching, as a matter of course, cannot be accounted for by optical intensity calculation.

The present invention was devised to solve the above-described problems, and an object of the present invention is to provide a pattern size correcting device and a pattern size correcting method that enable quantitative estimation of size variation occurring in patterns exposed in lithography and easy and accurate correction of pattern size based on this estimation, thereby enabling production of an extremely reliable device.

SUMMARY OF THE INVENTION

A pattern size correcting device and a pattern size correcting method of the present invention aim at those for correcting size variation that occurs in an actual device pattern formed in photolithography depending on open area ratio of light transmitting areas around the actual device pattern.

A pattern size correcting device of the present invention includes: a testing photomask having a test pattern; a quantifying unit that quantifies, using the testing photomask, the size variation in the test pattern as a function of distance and in relation to the open area ratio; an open area ratio calculating unit that divides an exposure area having the plural actual device patterns into a plurality of correction areas and calculates the open area ratio of the respective correction areas; and a data correcting unit that inputs the open area ratio calculated by the open area ratio calculating unit to a result of the quantification, calculates the size variations of the actual device patterns in the respective correction areas, and corrects design data of the actual device patterns based on the calculation.

Another form of the pattern size correcting device of the present invention includes: an open area ratio calculating unit that divides an exposure area having a plurality of actual device patterns into a plurality of correction areas and calculates open area ratio of light transmitting areas of the respective correction areas; and a data correcting unit that calculates, using the calculated open area ratio, size variations occurring in the actual device patterns in the respective correction areas and corrects design data of the actual device patterns based on the calculation.

A pattern size correcting method of the present invention includes: a first step of quantifying, using a testing photomask having a test pattern, the size variation in the test pattern as a function of distance and in relation to the open area ratio; a second step of dividing an exposure area having the plural actual device patterns into a plurality of correction areas and calculating the open area ratio of the respective correction areas; and a third step of inputting the calculated open area ratio into a result of the quantification, calculating the size variations of the actual device patterns in the respective correction areas, and correcting design data of the actual device patterns based on the calculation.

Another form of the pattern size correcting method of the present invention includes: a first step of dividing an exposure area having a plurality of actual device patterns into a plurality of correction areas and calculating open area ratio of light transmitting areas of the respective correction areas; and a second step of calculating, using the calculated open area ratio, size variations occurring in the actual device patterns in the respective correction areas and correcting design data of the actual device patterns based on the calculation.

BRIEF DESCRIPTION OF THE DRAWINGS

FIG. 3A to FIG. 3C are flowcharts showing the respective procedures of pattern size correction of this embodiment;

DETAILED DESCRIPTION OF THE PREFERRED EMBODIMENTS

—Basic Gist of the Present Invention—

To begin with, the basic gist of the present invention will be described.

The present inventors have found out that the influence of local flare and a loading effect in etching that cause variation in pattern size occurs in relation to open area ratio or resist pattern density of patterns proximate to a subject pattern and the distance between patterns.

Figure 1:
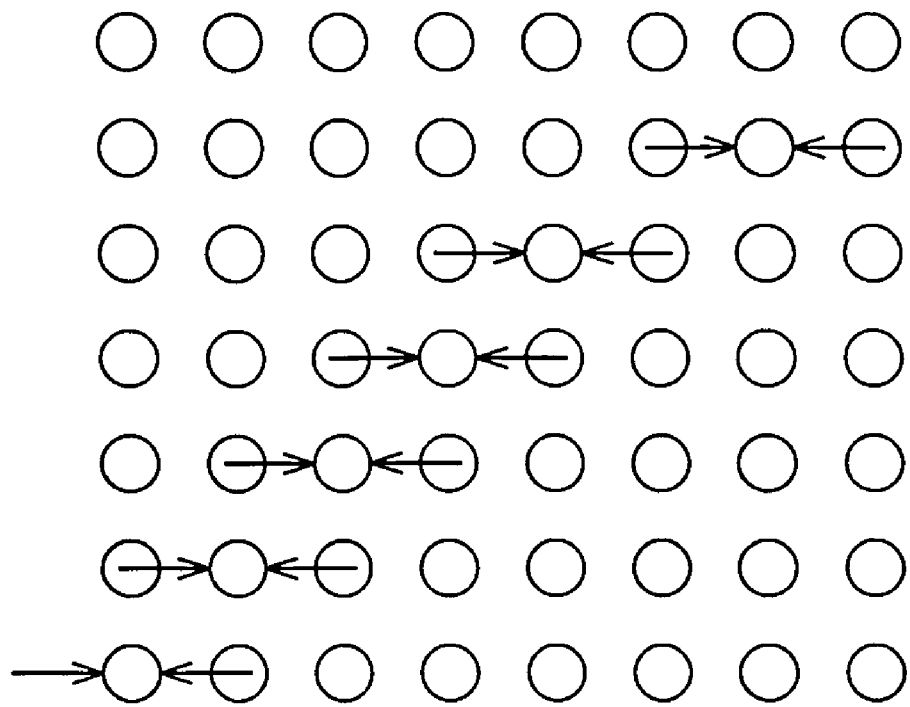
FIG. 1 is a rough plane view showing a state when hole patterns are exposed and developed by an ArF stepper.

For example, if hole patterns as shown in FIG. 1, which are exposed and developed by an ArF stepper, are measured from the periphery toward the center, it is found that hole size gradually increases by 10 nm or more in an area covering several ten μm from the periphery. On the other hand, as a result of simulation of an optical proximity effect on the hole patterns, only the size of the patterns on the outer most periphery decreases by about 2 nm. Therefore, the result from the experiment and the simulation of the optical proximity effect do not match each other, which makes it clear that the pattern size varies depending on the distance and the open area ratio and the influence by the local flare occurs.

Specifically, in any subject actual device pattern (a device pattern actually formed in a lithography process), surrounding patterns of the actual device pattern are found, and open area ratio of the actual device patterns is calculated with a function of distance. The function has to decrease with an increase of distance, and a Gaussian function, a double Gaussian function, a triangular wave function, and the like are appropriate. At this time, in the present invention, considering improvement in a processing speed, an exposure area having the actual device patterns is divided into a plurality of correction areas, and open area ratio in the respective correction areas is calculated. Specifically, the exposure area is divided into the correction areas in meshes, one side of each mesh being about several μm order, and in the calculation, it is assumed that the open area ratio is uniform in a mesh. This is called a pattern area density map method and can greatly improve the processing speed.

In order to calculate size variation of the actual device pattern, a light intensity profile is approximated with a Gaussian function or a trapezoidal function, and the correlation between the open area ratio calculated from pattern data and the actual size of the pattern formed on a sample substrate, which is measured with a SEM or the like, is found. Consequently, it is possible to approximate the open area ratio in the vicinity of the given pattern with a function and estimate size variation. Design data of the actual device pattern is corrected, so that it is possible to form a photo mask (reticle) having patterns with the influence of local flare in photolithography being corrected. In correcting reticle size, since there is an optical proximity effect, the size variation is converted to an amount of change in reticle size or correction processing of the optical proximity effect is performed to prepare size data on a desired reticle.

CONCRETE EMBODIMENT

Hereinafter, a concrete embodiment will be described based on the above-described basic gist of the present invention.

In this embodiment, a pattern size correcting device and a pattern size correcting method for correcting the size of a device pattern formed in a lithography process will be disclosed. In this embodiment, the influence of local flare of a stepper is assumed to be a cause of variation in pattern size, but the influence by a loading effect in an etching process can similarly be derived from the relation to the resist pattern density of surrounding patterns.

Figure 2:
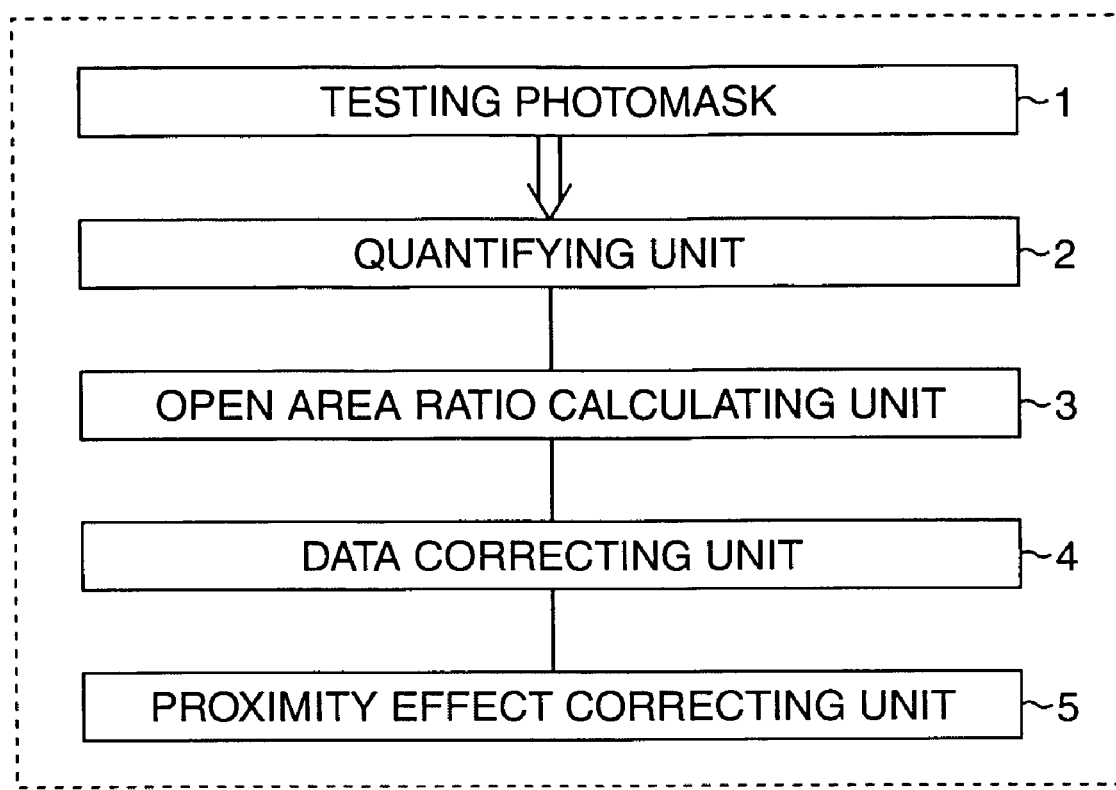
FIG. 2 is a block diagram showing a rough structure of a pattern size correcting device of this embodiment.

As shown in FIG. 2, the pattern size correcting device includes: a testing photomask 1 having a test pattern; a quantifying unit 2 that quantifies, using the testing photomask 1, size variation of the test pattern as a function of distance and in relation to an open area ratio; an open area ratio calculating unit 3 that divides an exposure area having the plural actual device patterns into a plurality of correction areas to calculate the open area ratio in the respective correction areas; a data correcting unit 4 that inputs the open area ratio calculated by the open area ratio calculating unit 3 to the result of the quantification that uses the testing photomask 1, calculates size variations of the actual device patterns in the respective correction areas, and corrects design data of the actual device patterns based on the calculation; and a proximity effect correcting unit 5 that corrects a proximity effect.

The correcting method using the pattern size correcting device structured above will be described below together with functions of the above-described respective units.

FIG. 3A, FIG. 3B, and FIG. 3C are flowcharts showing the respective procedures of pattern size correction.

In the procedure 1 in FIG. 3A, through later—described Steps S2 to S4, the size of the actual device patterns is corrected according to the open area ratio in the respective correction areas based on the correlation between the open area ratio and pattern size variation, optical proximity effect correction by the proximity effect correcting unit 5 follows at Step 5, and design data for a reticle to be formed is prepared.

Further, in the procedure 2 in FIG. 3B, after an optical proximity effect is corrected at Step S12, the size of the actual device patterns is corrected according to the open area ratio of the respective correction areas through Steps S13 to S15, which will be described later, and design data for a reticle to be formed is prepared. Note that a value of the aforesaid correction is a numerical value on a wafer, and therefore, a size correction value on the reticle takes a value according to exposure conditions and the kind of the pattern. The reason for additionally performing the optical proximity effect correction as in the procedures 1, 2 is that the size variation caused by the optical proximity effect and the size variation accompanying the change in open area ratio occur independently of each other and thus each correction has to be performed independently.

Further, in the procedure 3 in FIG. 3C, after an optical proximity effect is corrected at Step S22, an optical proximity effect is corrected again at Step S26 after Steps S23 to S25 which will be described later, and then design data for a reticle to be formed is prepared. This is because if, for example, the correction according to the pattern open area ratio follows the optical proximity effect correction, the optical proximity effect correction is sometimes needed again in order to form the pattern on a photoresist on the sample substrate as prescribed by the corrected design data.

Steps S1 to S6 will be described below, taking FIG. 3A as an example.

First, design data is inputted to the pattern size correcting device (Step S1).

Next, using the testing photomask 1, the quantifying unit 2 quantifies size variation in the test pattern as a function of distance and in relation to the open area ratio (Step S2).

Figure 4A:
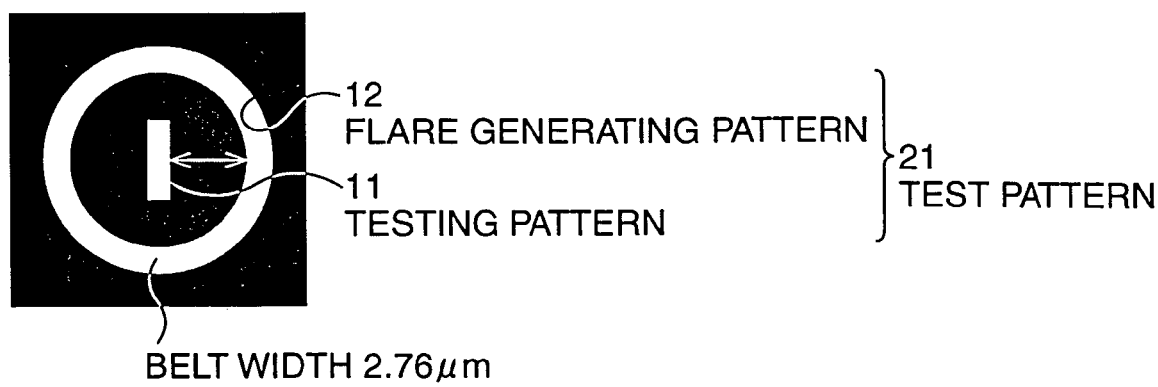
FIG. 4A and FIG. 4B are a schematic view showing a rough structure of a testing photomask and a chart showing the relation between a radius of exposure of a ring-belt pattern and pattern size variation occurring in a testing pattern.

Here, the testing photomask 1 has test patterns 21 as shown in FIG. 4A, and each of the test patterns includes a basic structure of the combination of a testing pattern 11 and a flare generating pattern 12, the testing pattern 11 having a pattern size (here, line width) of, for example, 120 μm, and the flare generating pattern 12 surrounding the testing pattern 11 to form a light transmitting area in a ring-belt shape and having a width of, for example, 2.76 μm. Here, the correlation between the open area ratio which gives an influence to the measured testing pattern 11 at the center and the distance is found by exposure under varied radius of the flare generating pattern 12. An Arf stepper and a positive resist are used for the exposure, and exposure only of the testing pattern 11 without any exposure of the flare generating pattern 12 is used as a reference.

Figure 4B:
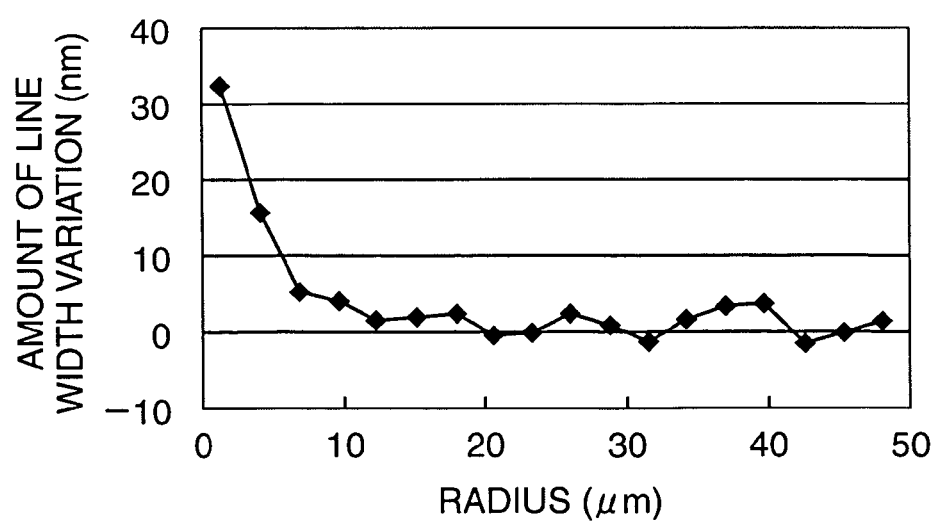

FIG. 4B shows the correlation between the radius of exposure of the flare generating pattern 12 and pattern size variation occurring in the testing pattern 11. Here, the pattern size variation is represented by a difference from the reference size in the case of only the testing pattern 11 is exposed.

Where the radius of exposure of the flare generating pattern 12 is large, the influence of local flare is given from a distant place, and an area a certain degree distance away does not undergo the size variation, so that the same size as the reference size when only the testing pattern 11 is formed is obtainable (the difference value approximates zero). On the other hand, it is seen that when the flare generating pattern 12 becomes closer, the influence of the local flare is given, so that a measured value (a difference value) of pattern size of the testing pattern 11 becomes larger.

Next, the open area ratio calculating unit 3 calculates the open area ratio of the respective divided correction areas (Step S3).

Here, in order to calculate the open area ratio influenced by the local flare in a given actual device pattern, it can be derived by integrating patterns proximate to each given pattern as a function of distance. As a function for approximation of the open area ratio, a Gaussian function shown in the formula (1) or a triangular wave shown in the formula (2) can be used, where γ represents the influence of the open area ratio.

$$f(x, y) = \frac{1}{2\pi}\left\{\frac{1}{\gamma^2}\exp\left(-\frac{x^2 + y^2}{\gamma^2}\right)\right\} \quad (1)$$

$$f(x, y) = -\sqrt{\frac{x^2 + y^2}{\gamma^2}} + 1 \quad (2)$$

Calculation on all the given patterns as described above would result in great delay in processing speed. Therefore, in this embodiment, in order to achieve a practical processing speed, an exposure area having a plurality of actual device patterns is divided into a plurality of correction areas, here, divided into meshes, by arbitrary grids, and the open area ratio in each of the correction areas is calculated separately. A method of thus dividing the exposure area into the correction areas to approximate the pattern density is called a pattern area density map method (Japanese Patent Application Laid-open No. 2001-52999) in calculating the influence of backscatter electrons in the electron beam exposure technique. When the pattern open area ratio in the divided correction areas is to be expressed, the dividing grid preferably has a size of about 1/10 or smaller of a range of the influence by the local flare or the like.

Figure 5:
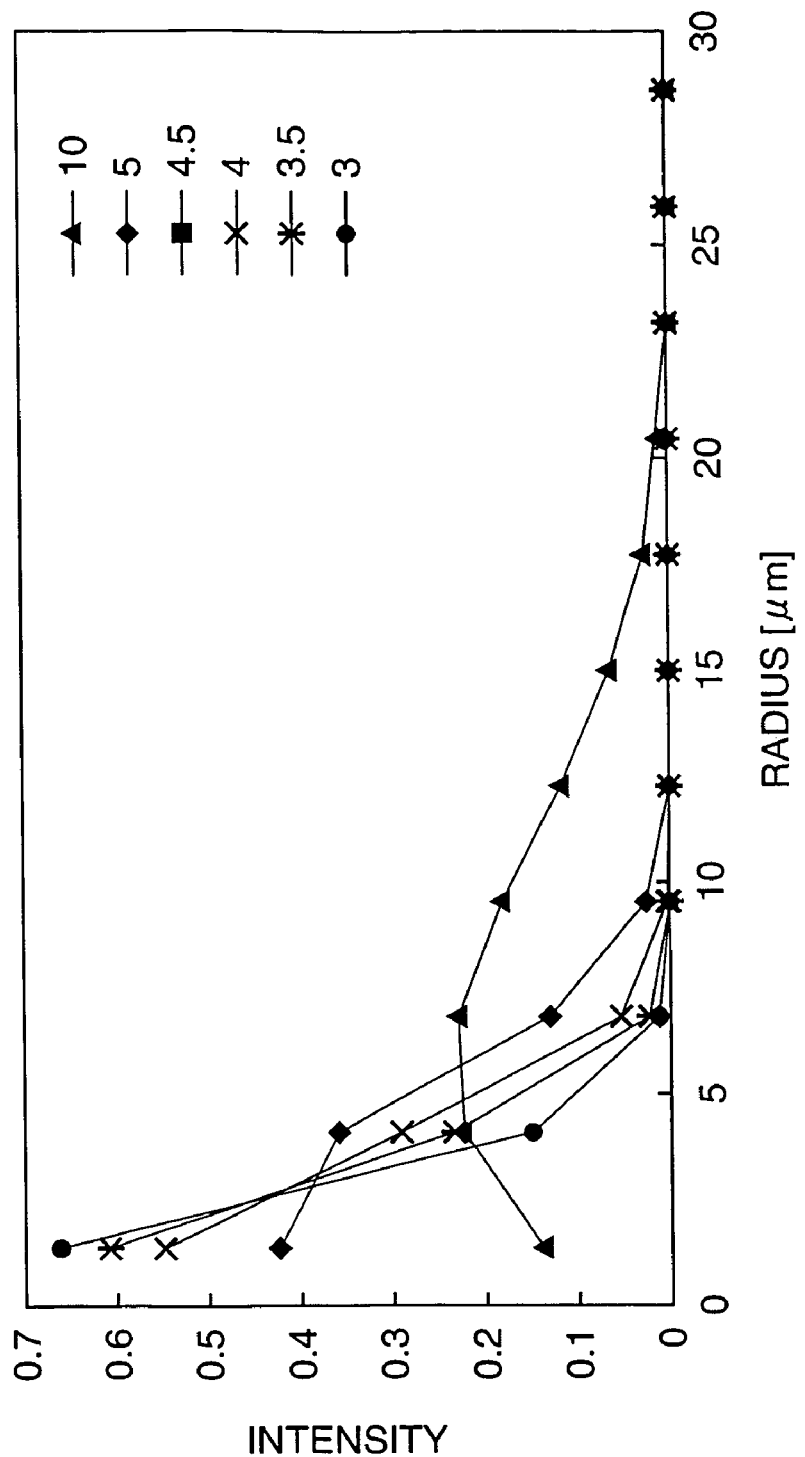
FIG. 5 is a characteristic chart showing the result of calculating the effect of local flare with a Gaussian function based on the test pattern as shown in FIG. 4A and FIG. 4B.

For example, FIG. 5 shows the result of calculating the influence of the local flare (γ) with the Gaussian function shown in the formula (1) based on the test pattern as shown in FIG. 4A.

The comparison between the experiment result in FIG. 4B and the calculation result in FIG. 5 shows that a γ value is about 5 μm and the distribution tendencies match each other.

Therefore, it is thought to be appropriate to form the correction areas with the dividing grid being about 0.5 µm, assuming that the influence range of the open area ratio is about 5 µm.

Here, as a function for approximation of the open area ratio, the use of two Gaussian functions (double Gaussian function) or three or more Gaussian functions is also possible instead of the use of the Gaussian function shown in the formula (1) (single Gaussian function). So, taking the double Gaussian function as an example, the advisability of the adoption thereof will be discussed.

Figure 6A:
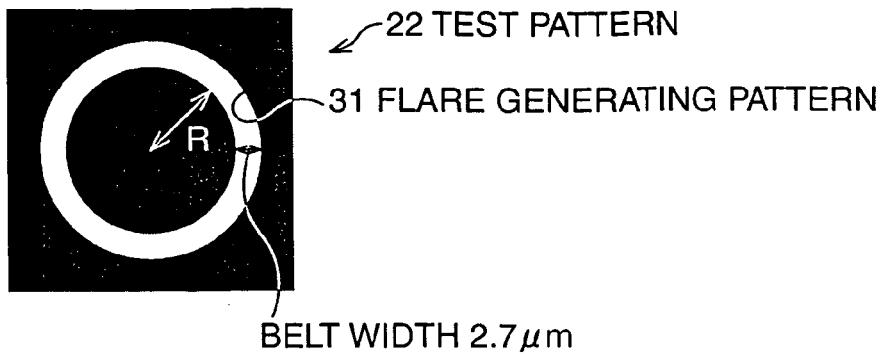
FIG. 6A to FIG. 6D are schematic views showing other examples of a test pattern for local flare generation.
Figure 6B:
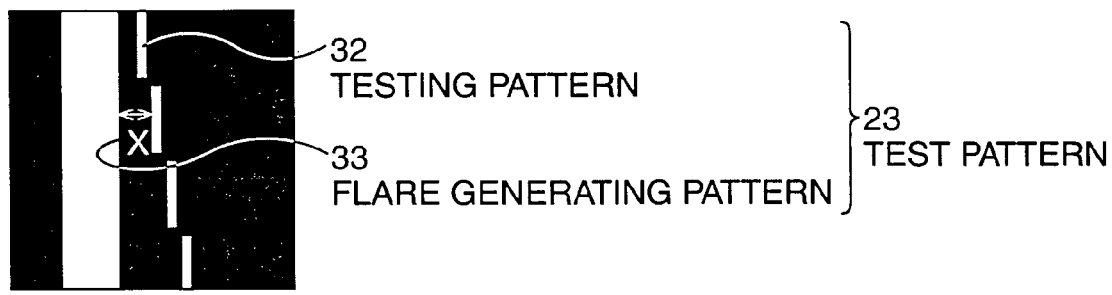
Figure 6C:
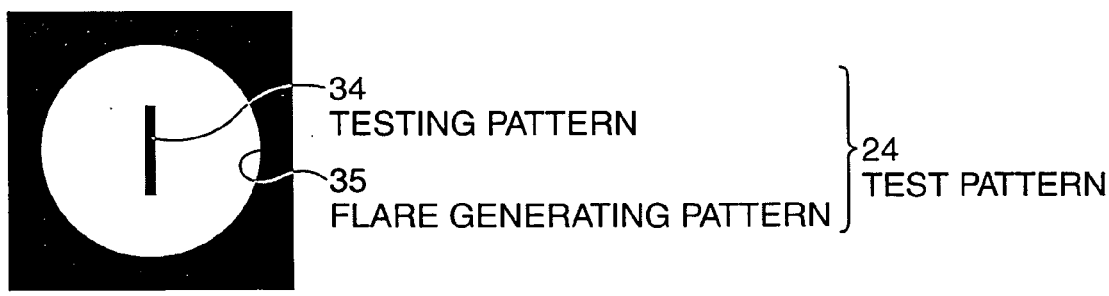
Figure 6D:
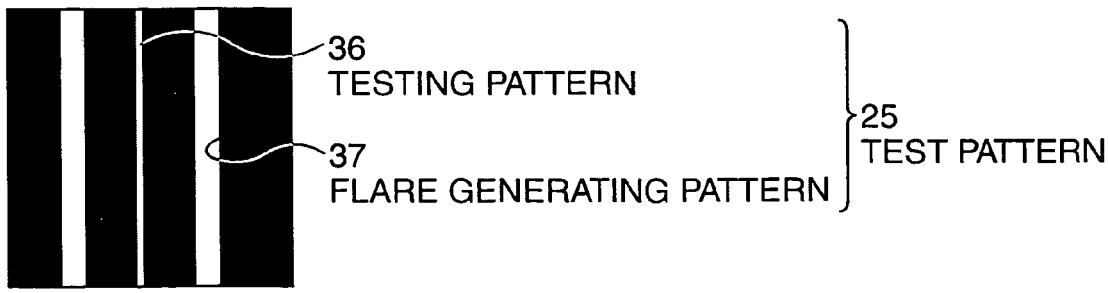
Figure 7B:
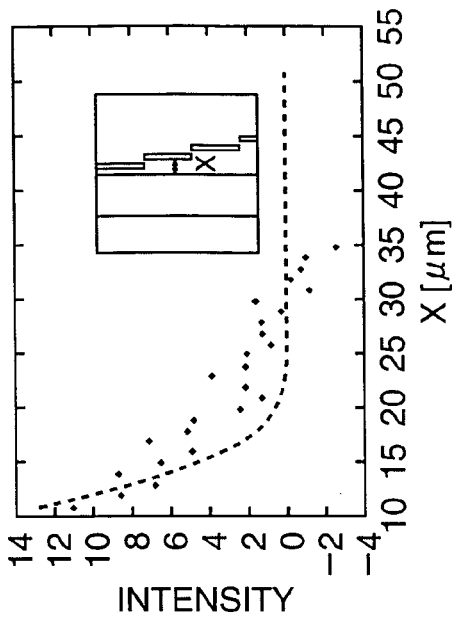
FIG. 7A to FIG. 7D are characteristic charts showing results of fitting the influence of the open area ratio with a single Gaussian function.
Figure 7D:
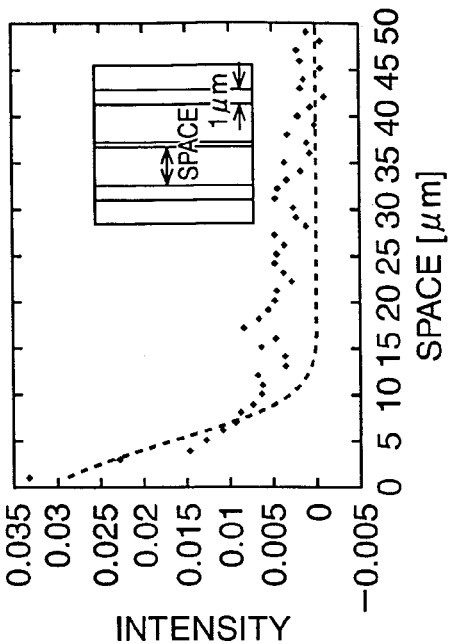
Figure 7A:
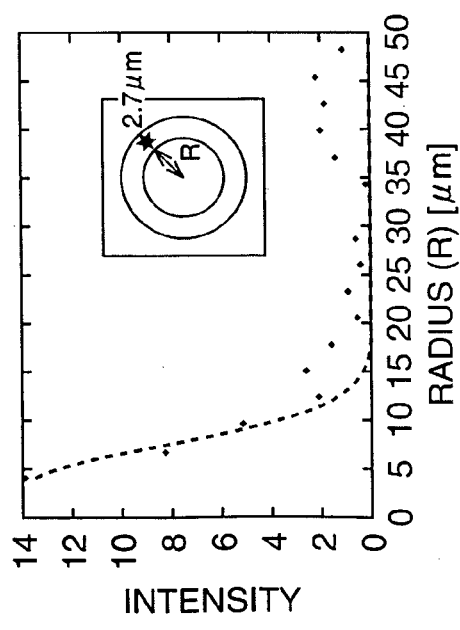
Figure 7C:
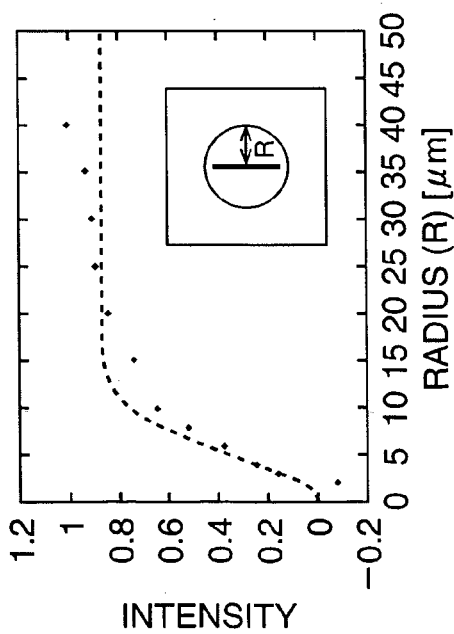
Figure 8A:
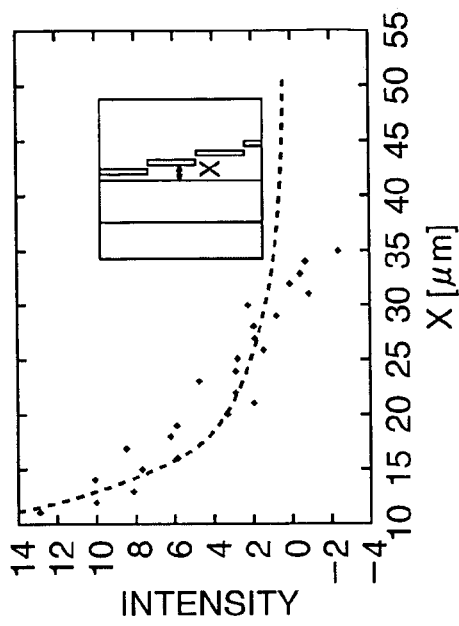
FIG. 8A to FIG. 8D are characteristic charts showing results of fitting the influence of the open area ratio with a double Gaussian function.
Figure 8B:
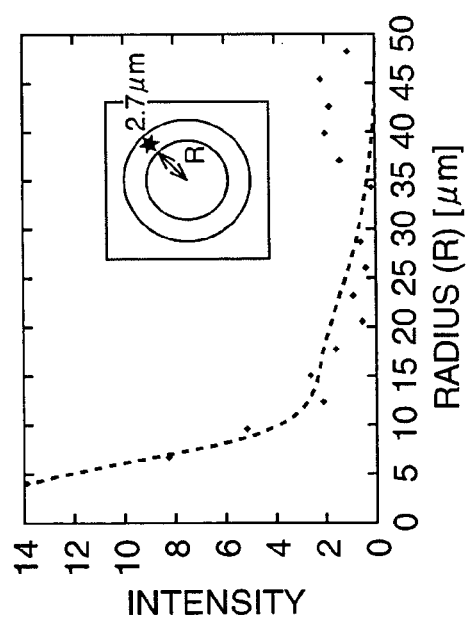
Figure 8C:
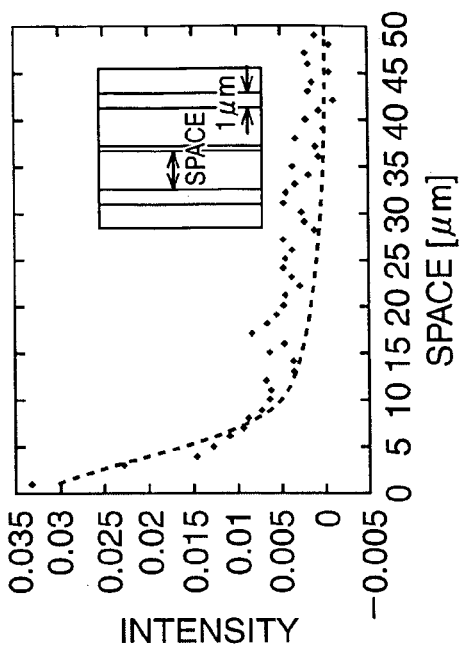
Figure 8D:
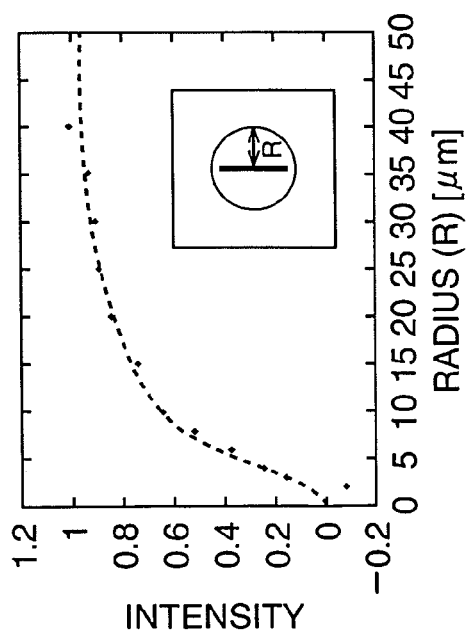

As a test pattern for the generation of local flare, for example, four kinds of test patterns as shown in FIG. 6A to FIG. 6D are also usable besides the example in FIG. 4A. FIG. 6A shows an example of a test pattern 22 having only a flare generating pattern 31 in a ring-belt shape forming a light transmitting area with a width of, for example, 2.7 µm, FIG. 6B shows an example of a test pattern 23 having a belt-shaped flare generating pattern 33 and a plurality of line-shaped test patterns 32 which are apart from the flare generating pattern 33 and whose distance from the flare generating pattern 33 is made larger in sequence, FIG. 6C shows an example of a test pattern 24 having a flare generating pattern 35 which has disk shape and a line-shaped testing pattern 34 disposed in the flare generating pattern 35, and FIG. 6D shows an example of a test pattern 25 having a belt-shaped testing pattern 36 and belt-shaped flare generating patterns 37 (1 µm in width) formed to be parallel with the testing pattern 36.

When the open area ratio giving an influence to a given pattern is calculated as a function of distance from a given pattern, the four kinds of patterns as in FIG. 6A to FIG. 6D are also usable for estimation and the same solution should be derived.

FIG. 7A to FIG. 7D show the results of fitting the influence of the open area ratio with the single Gaussian function. Here, FIG. 7A, FIG. 7B, FIG. 7C and FIG. 7D correspond to the cases of the test patterns in FIG. 6A, FIG. 6B, FIG. 6C and FIG. 6D respectively. It is seen that the manner of fitting differs depending on the test patterns. It is seen that there is a tendency that some place undergoes a more distant influence while the size changes near the given pattern. This implies the possibility that more precise fitting may be achieved with the plural Gaussian functions in order to faithfully express the experiment results.

FIG. 8A to FIG. 8D show the results of fitting the influence of the open area ratio with two Gaussian functions, i.e., a double Gaussian function (1') formula below. Note that β is a coefficient in entering the influence of the open area ratio into size variation. In FIG. 8A to FIG. 8D similarly to FIG. 7A to FIG. 7D, FIG. 8A, FIG. 8B, and FIG. 8C also correspond to the cases of the test patterns in FIG. 6A, FIG. 6B, and FIG. 6C respectively.

$$a_{l,m} = \frac{1}{\pi \gamma^2} \int_{lA-A/2}^{lA+A/2} \exp\left[-\frac{x^2}{\gamma^2}\right] dx \int_{mA-A/2}^{mA+A/2} \exp\left[-\frac{y^2}{\gamma^2}\right] dy \quad (1)$$

$$= \frac{1}{4}\left\{\mathrm{erf}\left(\frac{(l+0.5)A}{\gamma}\right) - \mathrm{erf}\left(\frac{(l-0.5)A}{\gamma}\right)\right\} \times$$

$$\left\{\mathrm{erf}\left(\frac{(m+0.5)A}{\gamma}\right) - \mathrm{erf}\left(\frac{(m-0.5)A}{\gamma}\right)\right\}'$$

Thus, it is seen that the use of the double Gaussian function achieves more precise fitting for all the test patterns than the use of the single Gaussian function.

Figure 9:
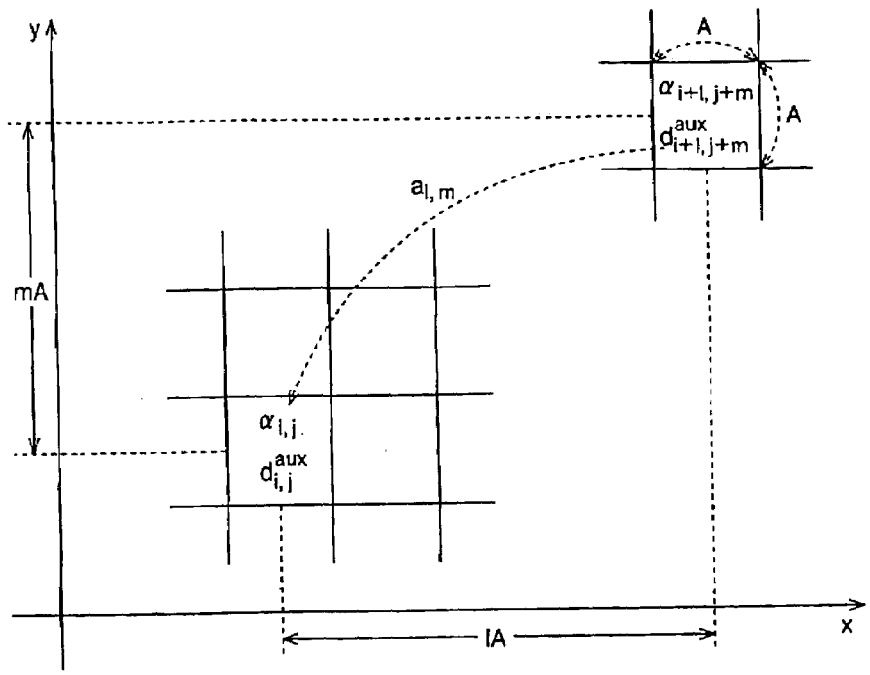
FIG. 9 is a schematic chart to explain a method, in a pattern area density map method, of calculating an effective area density based on the influence of local flare, by Gaussian approximation.

A method of calculating, in a pattern area density map method, effective area density based on the influence of local flare by Gaussian approximation will be described with reference to FIG. 9. FIG. 9 is a chart showing the state in which exposure data is divided into square correction areas each having a size of A×A. Here, an amount of size variation in an $(i+l, j+m)^{th}$ correction area distant by (lA, mA) has an expansion caused by local flare or the like by a stepper, and thus giving an influence to size variation of an $(i, j)^{th}$ correction area. A contribution $a_{l,m}$ by local flare from the $(i+l, j+m)^{th}$ correction area distant by (lA, mA) is expressable by the following formula (3) in a manner that influences from the areas with A×A are integrated. In the case of approximation with a triangular wave, the formula (2) is substituted in an exp part in the formula (3).

$$f(x, y) = \frac{1}{\pi(\beta_1 + \beta_2)}\left\{\frac{\beta_1}{\gamma_1^2}\exp\left(-\frac{x^2+y^2}{\gamma_1^2}\right) + \frac{\beta_2}{\gamma_2^2}\exp\left(-\frac{x^2+y^2}{\gamma_2^2}\right)\right\} \quad (3)$$

Here, if pattern area density in the $(i+l, j+m)^{th}$ correction area distant by (lA, mA) is $\alpha_{i+l, j+m}$, the contribution of the local flare from the $(i+l, j+m)^{th}$ correction area is $a_{l,m} \times \alpha_{i+l, j+m}$. Therefore, the sum total of the contributions from the respective correction areas that are within about two times the radius γ from the center is entered, and an effective area density $\alpha'_{i,j}$ of the $(i, j)^{th}$ correction area after a planarization process is expressable by the formula (4).

$$\alpha'_{i,j} = \sum_l \sum_m a_{l,m} \alpha_{i+l, j+m} \quad (4)$$

Next, the data correcting unit 4 expresses the correlation between the calculated open area ratio and the pattern size variation by a function (Step S4).

As an approximation method, a Gaussian function or a trapezoidal wave is usable. For example, when a value of size variation is approximated with the Gaussian function, it is expressable by the formula (5), where α is a parameter related to the size variation.

$$f(x, y) = \frac{1}{\alpha^2}\exp\left(-\frac{x^2+y^2}{\alpha^2}\right) \quad (5)$$

Therefore, the size in a given pattern correlates with the sum of surface integral values of the formula (4) into which the open area ratio is entered and the formula (5) accounting for the size variation. It can be calculated from a value with which the sum of the aforesaid value corresponding to the open area ratio and value corresponding to the size variation gives a certain threshold as shown in formula (6), where W is a pattern size after correction. Note that β is a coefficient in entering the influence of the open area ratio into the size variation.

$$F(x, y) = \quad (6)$$

$$\frac{1}{2}\left\{\mathrm{erf}\left(\frac{\frac{w}{2}-x}{\alpha}\right) - \mathrm{erf}\left(\frac{-\frac{w}{2}-x}{\alpha}\right)\right\} + \beta \times \alpha_{i,j} = \text{Threshold}$$

Figure 10:
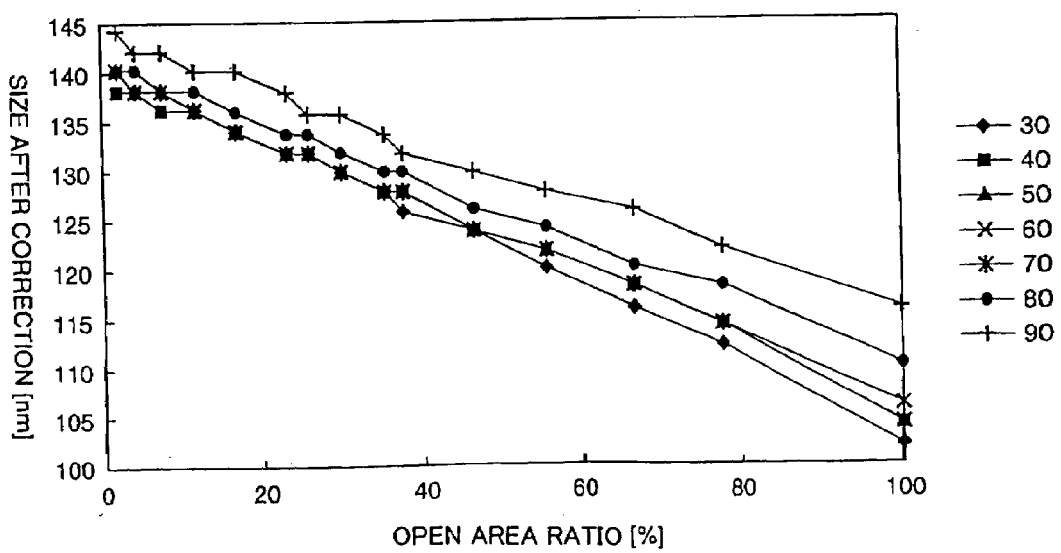
FIG. 10 is a characteristic chart showing the result of simulations on a pattern of 140 nm in pattern size, in which a value of $\alpha$ is intentionally changed for fitting when parameters $\alpha$, $\beta$, $\gamma$ are made to approximate the correlation between the open area ratio and pattern size.

What matters in thus calculating the correction value of the pattern size with the double Gaussian is whether the size variation amount is sufficiently explained by the integration of Gaussian shown in the first term. So, an example is shown in which the size variation is estimated from the calculated open area ratio in a given pattern using the aforesaid double Gaussian. FIG. 10 shows the result of simulations on a pattern of 140 nm in pattern size, in which a value of $\alpha$ is intentionally changed for fitting when parameters $\alpha$, $\beta$, $\gamma$ are made to approximate the correlation between the open area ratio and pattern size shown in FIG. 4B. When the a value becomes larger than 80 nm, the size correction value begins to be alienated from those in a group with the a value of 70 nm or less. This implies that there exists in a given pattern size an $\alpha$ value that is effective in expressing the open area ratio as the pattern size, and shows that $\alpha$ has to be ½ of a target pattern size or smaller.

Figure 11:
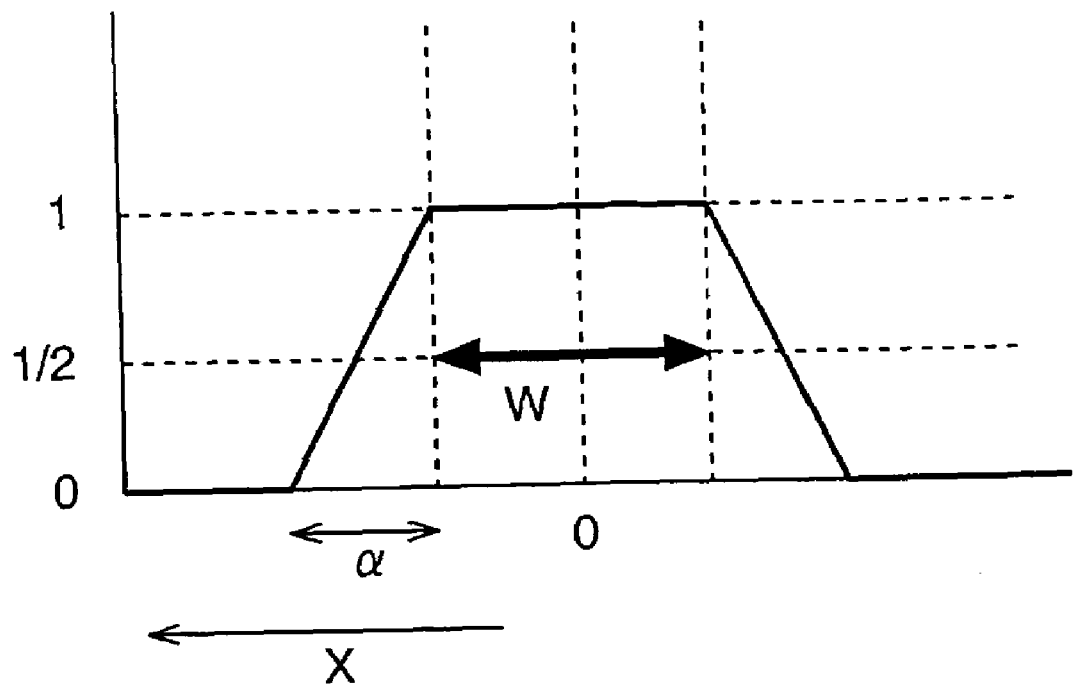
FIG. 11 is a characteristic chart showing a case where a trapezoidal wave is used as an approximation function.

It is supposed that this is because the correlation between the open area ratio and the pattern size varies substantially linearly and is abruptly deviated from a linear function near the bottom or the peak in Gaussian. Therefore, it is seen that a trapezoidal wave is also usable as an approximation function as shown in FIG. 11. In the case of approximation with the trapezoidal wave, the first term of the formula (6) can be expressed by the formula (7). $\alpha$ is a size difference when the open area ratio changes from 0 to 100%, i.e., to the maximum, and when an arbitrary intensity is ½, the size is W.

When $0 \leq x < w/2 - \alpha/2$, $f(x)=1$.

When $w/2-\alpha/2 \leq x \leq w/2+\alpha/2$, $f(x)=0.5(x-w/2)/\alpha-½$.

When $x > w/2+\alpha/2$, $f(x)=0$ (7)

Thus, the open area ratio in a given actual device pattern in each of the correction areas is approximated with the Gaussian, double Gaussian or the triangular wave and an amount of pattern size variation is approximated with the Gaussian or the trapezoidal wave so as to enable the correction in relation to the open area ratio, and then the procedure for extraction of the correction amount and the correction follows. For reference, in the electron beam lithography technique, there is a method of approximating forward scatter and backward scatter, which have physical meanings, with a Gaussian to correct a proximity effect in each correction area (Japanese Patent Application No. 2001-112787, Japanese Patent Application No. 2001-153233).

Figure 12:
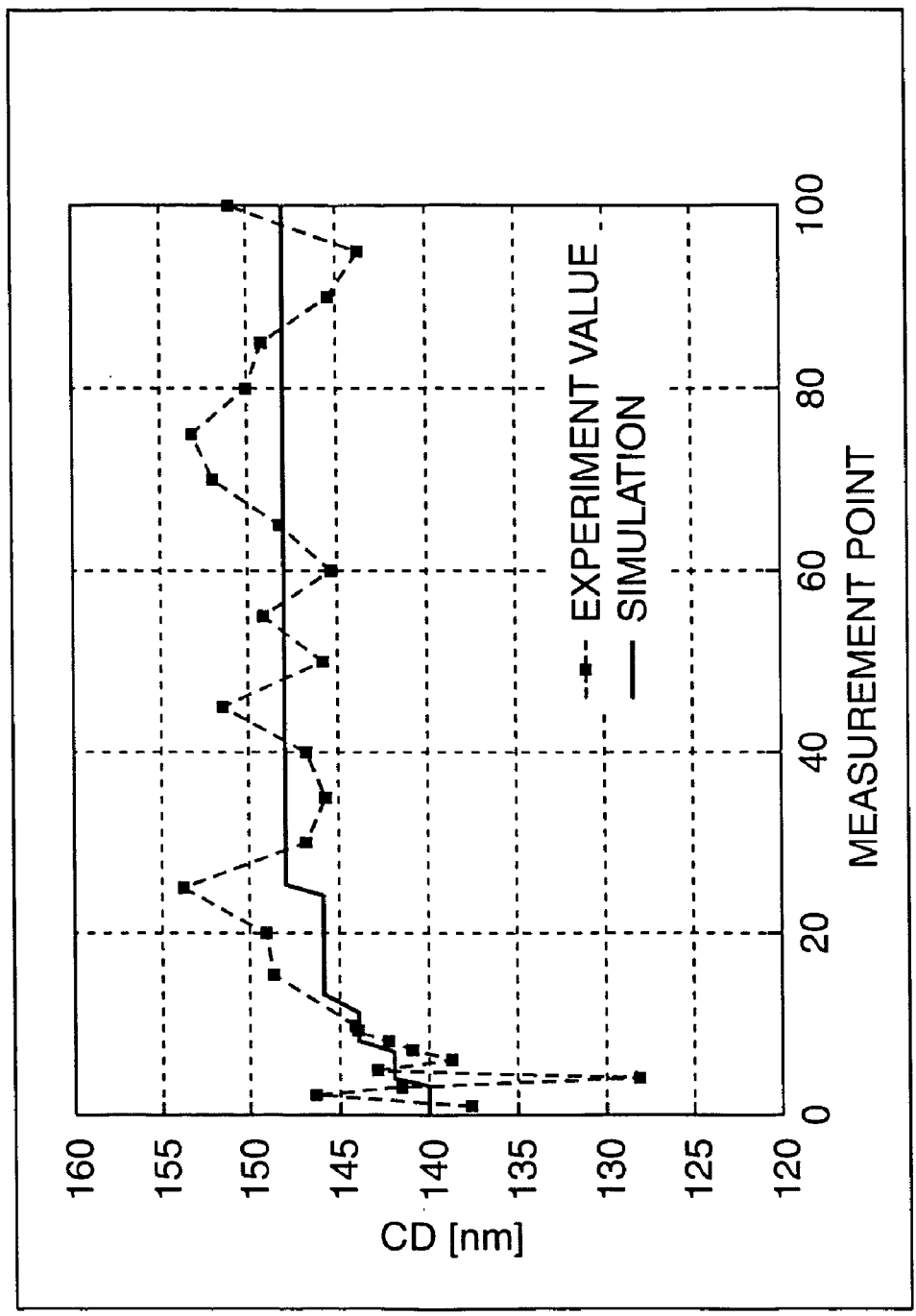
FIG. 12 is a characteristic chart showing an evaluation result on a given pattern size when the influence of the open area ratio is approximated with a Gaussian function based on a pattern area density map method and an amount of size variation is approximated with a Gaussian function.

FIG. 12 shows an evaluation result of a given pattern size when the influence of the open area ratio is approximated with the Gaussian function based on the pattern area density map method and an amount of the size variation is approximated with the Gaussian function.

In this calculation, the parameters $\alpha$, $\beta$, $\gamma$ were fitted based on the exposure result shown in FIG. 4B. Actual measurement values are values measured with an SEM and an ArF stepper and a positive resist were used at the time of measurement. The hole pattern shown in FIG. 1 (a pattern in which patterns each having a 140 nm via diameter are arrange at a 280 nm pitch) is used in the evaluation, and the measurement with the SEM and calculation progress from a corner of a pattern area toward the center thereof. The horizontal axis shows the number of measured patterns when a measurement point was shifted from the corner of the pattern area toward the center, and the vertical axis shows measured and calculated hole sizes. The hole size becomes larger toward the center, and it is seen that the values calculated by the method of this embodiment can account for this. This is a result of approximation of the variation amount of the pattern size with the Gaussian, but a similar result is obtained when the trapezoidal wave is used. Therefore, the fact that the size variation caused by the influence of local flare changes depending on the open area ratio can be explained by this embodiment, and the correction of the pattern size value based on this value makes it possible to obtain high precision in size.

Figure 13:
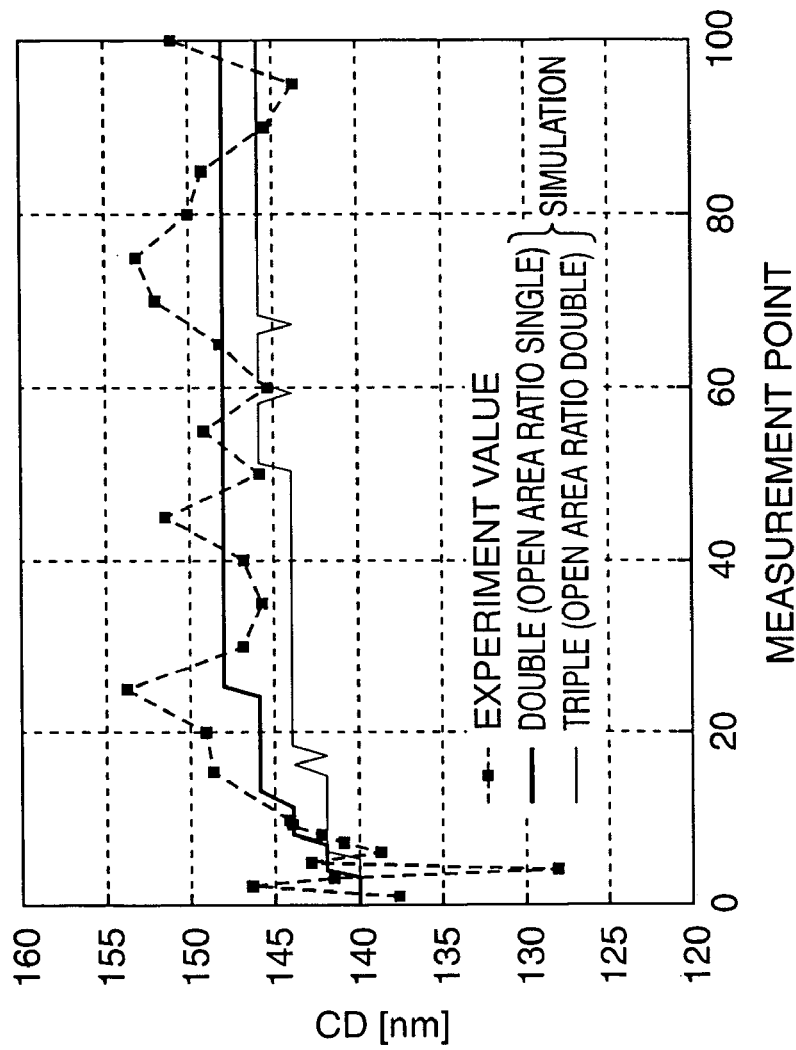
FIG. 13 is a characteristic chart showing the evaluation result on a given pattern size when the influence of the open area ratio is approximated with a double Gaussian function based on the pattern area density map method and an amount of size variation is approximated with a Gaussian function, the result being added to FIG. 12.

Further, FIG. 13 shows the evaluation result on a given pattern size when the influence of the open area ratio is approximated with a double Gaussian function based on the pattern area density map method and an amount of size variation is approximated with a Gaussian function, the result being added to FIG. 12.

In the approximation of the influence of the open area ratio with the double Gaussian function, similarly to the approximation thereof with the single Gaussian function, it can be explained that the size variation due to the influence of local flare changes depending on the open area ratio, and it is seen that the correction of the pattern size value based on this value makes it possible to obtain high precision in size.

Incidentally, in this embodiment, size correction accompanying the variation in the open area ratio is described, but since the optical proximity effect gives an influence in the photolithography as described above, optical proximity effect correction is added after the size correction according to the open area ratio (Step S5). Note that, in the test pattern 21 of the testing photomask 1 in this embodiment, with an amount of the optical proximity effect correction, the mask size of only the outer most peripheral patterns is increased by about 2 nm.

Then, design data of the actual device patterns for forming a reticle are outputted (Step S6).

Incidentally, in this embodiment, the correction of the influence by exposure, i.e., local flare is described, but the loading effect in etching that causes size variation in relation to the resist pattern density can be also corrected in a similar manner.

As has been described hitherto, according to this embodiment, it is possible to quantitatively estimate size variation occurring in a pattern exposed in photolithography and easily and accurately correct pattern size based on the estimation, so that an extremely reliable device can be manufactured.

The units constituting the pattern size correcting device and the steps (Steps S1 to S6 in FIG. 3A, Steps S11 to S16 in FIG. 3B, Steps S21 to S27 in FIG. 3C) of the pattern size correcting method according to the above-described embodiment are realizable by the operation of a program stored in a RAM, a ROM, or the like of a computer. The program and a computer-readable storage medium recording the program are included in the present invention.

Specifically, the program is recorded on a recording medium, for example, a CD-ROM, or is supplied to a computer via various kinds of transmission media. As a storage medium recording the aforesaid program, a flexible disc, a hard disc, a magnetic tape, a magneto-optic disc, a nonvolatile memory card, or the like is usable besides a CD-ROM. As a transmission medium of the aforesaid program, usable is a communication medium (a wire circuit such as an optical fiber, a wireless circuit, or the like) in a computer network (LAN, WAN such as the Internet, a radio communication network, or the like) system for supplying program information by propagating the program information as a carrier wave.

Further, not only when the functions of the above-described embodiment are realized by a computer executing a supplied program but also when the functions of the above-described embodiments are realized by the cooperation with OS (operating system) or other application software and the like under which the program is operating in the computer, and when the functions of the above-described embodiment are realized by a function expansion board or a function expansion unit of the computer processing the supplied program completely or partly, such a program is included in the present invention.

Figure 14:
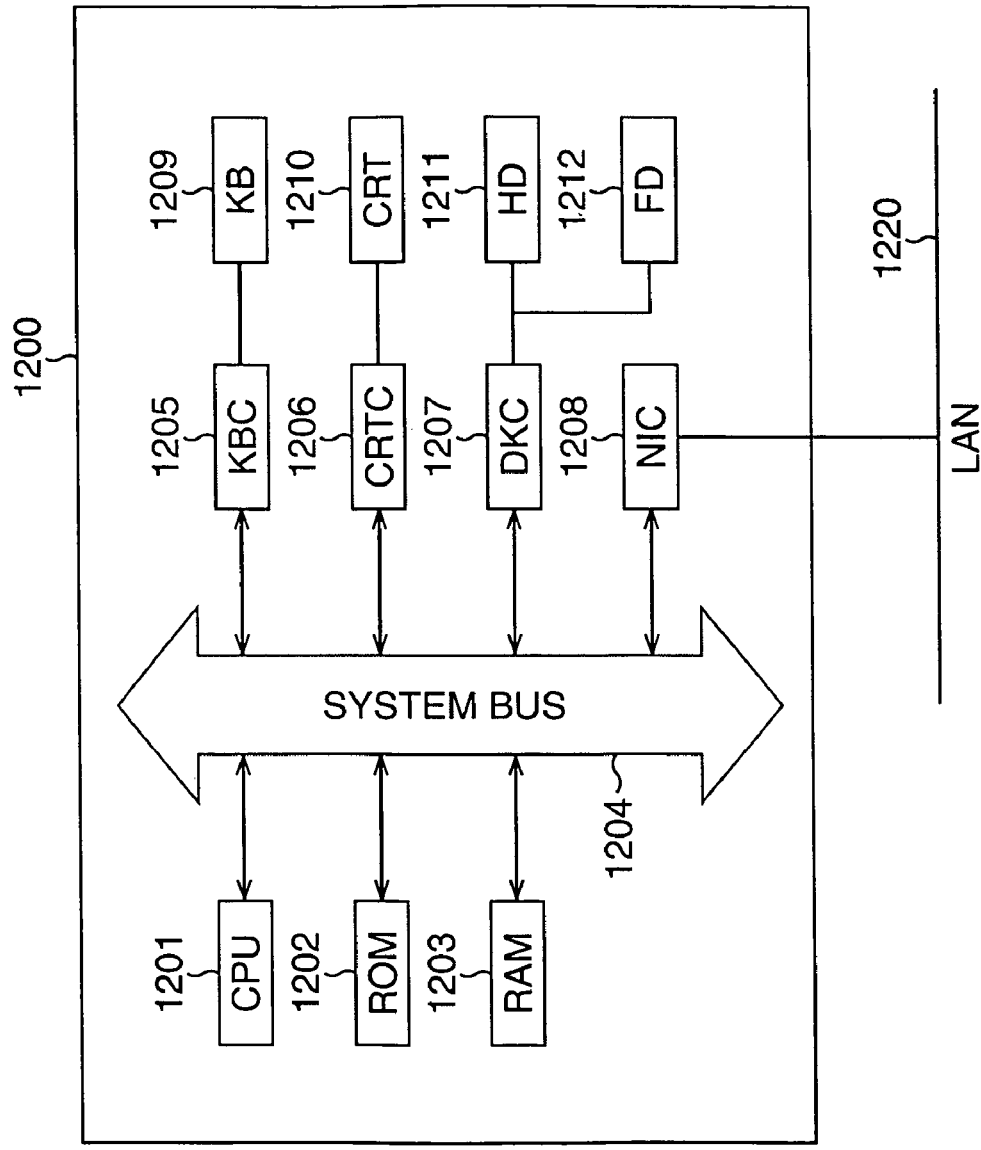
FIG. 14 is a schematic view showing an internal structure of a typical personal user terminal device.

For example, FIG. 14 is a schematic view showing an internal structure of a typical personal user terminal device. In FIG. 14, 1200 denotes a computer PC. The PC 1200 includes a CPU 1201 which executes device controlling software stored in a ROM 1202 or a hard disc (HD) 1211 or supplied by a flexible disc drive (FD) 1212, and centrally controls each device connected to a system bus 1204.

Patent document 1
Japanese Patent Application Laid-open No. 2001-52999
Patent document 2
Japanese Patent Application No. 2001-112787
Patent document 3
Japanese Patent Application No. 2001-153233
Non-patent document 1
Tae Moon Jeong, and so on (Samsung), 'Flare in Microlithographic Exposure Tools', Jpn. J. Appli. Phys. Vol. 41(2002)5113

INDUSTRIAL APPLICABILITY

According to the present invention, it is possible to provide a pattern size correcting device and a pattern size correcting method that enable quantitative estimation of size variation occurring in a pattern exposed in lithography and easy and accurate correction of pattern size based on the estimation, thereby enabling manufacturing of an extremely reliable device.

What is claimed is:

1. A pattern size correcting device for correcting size variation that occurs in an actual device pattern formed in photolithography depending on an open area ratio, wherein said open area ratio is a ratio of light transmitting areas in an area within a set distance in a prescribed place, wherein said prescribed place is a formed place of said actual device pattern, said device comprising:
a testing photomask having a test pattern;
a quantifying unit that quantifies, using said testing photomask, the size variation in the test pattern as a function of distance and in relation to the open area ratio which is defined by said testing photomask;
an open area ratio calculating unit that divides an exposure area having the plural actual device patterns into a plurality of correction areas and calculates effective said open area ratio of the respective correction areas; and
a data correcting unit that inputs the open area ratio calculated by said open area ratio calculating unit to a result of the quantification, calculates the size variations of the actual device patterns in the respective correction areas and corrects design data of the actual device patterns based on the size variation calculation.

2. The pattern size correcting device according to claim 1, wherein the test pattern of said testing photomask has: a measuring pattern as an object of the estimation of the size variation; and a plurality of flare generating patterns that are light transmitting areas causing the size variation in the measuring pattern and whose distances from the measuring pattern are different.

3. The pattern size correcting device according to claim 2, wherein said quantifying unit quantifies the size of the measuring pattern corresponding to each of the flare generating patterns in relation to the distance between the measuring pattern and each of the flare generating patterns, and based on the quantification, quantifies the size variation in relation to the open area ratio.

4. The pattern size correcting device according to claim 1, wherein said open area ratio calculating unit finds area density of each of the correction areas and calculates the open area ratio by approximation calculation using a Gaussian function.

5. The pattern size correcting device according to claim 1, wherein said open area ratio calculating unit finds area density of each of the correction areas and calculates the open area ratio by approximation calculation using at least two Gaussian functions.

6. The pattern size correcting device according to claim 1, wherein said data correcting unit calculates the size variation of the actual device pattern caused by variation in the open area ratio, by approximation calculation using a Gaussian function.

7. The pattern size correcting device according to claim 6, wherein the Gaussian function used in the calculation of the size variation by said data correcting unit has a numerical value whose value of 1/e of the Gaussian is equal to or smaller than ½ of a minimum pattern width included in the actual device pattern and is close to ½.

8. The pattern size correcting device according to claim 1, wherein said data correcting unit calculates the size variation of the actual device pattern caused by variation in the open area ratio, by approximation calculation using a trapezoidal function.

9. The pattern size correcting device according to claim 1, further comprising an optical proximity effect correcting unit.

10. A pattern size correcting device, comprising:
an open area ratio calculating unit that divides an exposure area having a plurality of actual device patterns into a plurality of correction areas and calculates effective said open area ratio of light transmitting areas of the respective correction areas; and
a data correcting unit that calculates, using the calculated open area ratio, size variations occurring in the actual device patterns in the respective correction areas and corrects design data of the actual device patterns based on the size variation calculation;
wherein said open area ratio is a ratio of light transmitting areas in an area within a set distance in a prescribed place, and wherein said prescribed place is a formed place of said actual device pattern.

11. The pattern size correcting device according to claim 10, wherein said open area ratio calculating unit finds area density of each of the correction areas and calculates the open area ratio by approximation calculation using a Gaussian function.

12. The pattern size correcting device according to claim 10, wherein said open area ratio calculating unit finds area density of each of the correction areas and calculates the open area ratio by approximation calculation using at least two Gaussian functions.

13. The pattern size correcting device according to claim 10, wherein said data correcting unit calculates the size variation of the actual device pattern caused by variation in the open area ratio, by approximation calculation using a Gaussian function.

14. The pattern size correcting device according to claim 13, wherein the Gaussian function used in the calculation of the size variation by said data correcting unit has a numerical value whose value of 1/e of the Gaussian is equal to or smaller than ½ of a minimum pattern width included in the actual device pattern and is close to ½.

15. The pattern size correcting device according to claim 10, wherein said data correcting unit calculates the size variation of the actual device pattern caused by variation in the open area ratio, by approximation calculation using a trapezoidal function.

16. The pattern size correcting device according to claim 10, further comprising an optical proximity effect correcting unit.

17. A pattern size correcting method for correcting size variation that occurs in an actual device pattern formed in photolithography depending on open area ratio, wherein said open area ratio is a ratio of light transmitting areas in an area within a set distance in a prescribed place, and said prescribed place is a formed place of said actual device pattern, said method comprising:
   a first step of quantifying, using a testing photomask having a test pattern, the size variation in the test pattern as a function of distance and in relation to the open area ratio which is defined by said testing photomask;
   a second step of dividing an exposure area having the plural actual device patterns into a plurality of correction areas and calculating effective said open area ratio of the respective correction areas; and
   a third step of inputting the calculated open area ratio into a result of the quantification, calculating the size variations of the actual device patterns in the respective correction areas, and correcting design data of the actual device patterns based on the size variation calculation.

18. The pattern size correcting method according to claim 17, wherein the test pattern of the testing photomask has: a measuring pattern as an object of the estimation of the size variation; and a plurality of flare generating patterns that are light transmitting areas causing the size variation in the measuring pattern and whose distances from the measuring pattern are different.

19. The pattern size correcting method according to claim 18, wherein in said first step, the size of the measuring pattern corresponding to each of the flare generating patterns is quantified in relation to the distance between the measuring pattern and each of the flare generating patterns, and based on the quantification, the size variation is quantified in relation to the open area ratio.

20. The pattern size correcting method according to claim 17, wherein in said second step, area density of each of the correction areas is found and the open area ratio is calculated by approximation calculation using a Gaussian function.

21. The pattern size correcting method according to claim 17, wherein in said second step, area density of each of the correction areas is found and the open area ratio is calculated by approximation calculation using at least two Gaussian functions.

22. The pattern size correcting method according to claim 17, wherein in said third step, the size variation of the actual device pattern caused by variation in the open area ratio is calculated by approximation calculation using a Gaussian function.

23. The pattern size correcting method according to claim 22, wherein the Gaussian function used in the calculation of the size variation in said third step has a numerical value whose value of 1/e of the Gaussian is equal to or smaller than ½ of a minimum pattern width included in the actual device pattern and is close to ½.

24. The pattern size correcting method according to claim 17, wherein in said third step, the size variation of the actual device pattern caused by variation in the open area ratio is calculated by approximation calculation using a trapezoidal function.

25. The pattern size correcting method according to claim 17, further comprising a fourth step of correcting an optical proximity effect.

26. The pattern size correcting method according to claim 25, wherein said fourth step is executed before said first step, after said third step, or both before said first step and after said third step.

27. A pattern size correcting method comprising:
   a first step of dividing an exposure area having a plurality of actual device patterns into a plurality of correction areas and calculating an effective open area ratio of light transmitting areas of the respective correction areas; and
   a second step of calculating, using the calculated open area ratio, size variations occurring in the actual device patterns in the respective correction areas and correcting design data of the actual device patterns based on the size variation calculation;
   wherein said open area ratio is ratio of light transmitting areas in an area within a set distance from a prescribed place.

28. The pattern size correcting method according to claim 27, wherein in said first step, area density of each of the correction areas is found and the open area ratio is calculated by approximation calculation using a Gaussian function.

29. The pattern size correcting method according to claim 27, wherein in said first step, area density of each of the correction areas is found and the open area ratio is calculated by approximation calculation using at least two Gaussian functions.

30. The pattern size correcting method according to claim 27, wherein in said second step, the size variation of the actual device pattern caused by variation in the open area ratio is calculated by approximation calculation using a Gaussian function.

31. The pattern size correcting method according to claim 30, wherein the Gaussian function used in the calculation of the size variation in said second step has a numerical value whose value of 1/e of the Gaussian is equal to or smaller than ½ of a minimum pattern width included in the actual device pattern and is close to ½.

32. The pattern size correcting method according to claim 27, wherein in said second step, the size variation of the actual device pattern caused by variation in the open area ratio is calculated by approximation calculation using a trapezoidal function.

33. The pattern size correcting method according to claim 27, further comprising a third step of correcting an optical proximity effect.

34. The pattern size correcting method according to claim 33, wherein said third step is executed before said first step, after said second step, or both before said first step and after said second step.

35. A computer-readable recording medium storing a computer program product for correcting size variation that occurs in an actual device pattern formed in photolithography depending on an open area ratio, said open area ratio is ratio of light transmitting areas in an area within a set distance in a prescribed place, and said prescribed place is a formed place of said actual device pattern, the computer program product comprising:

- program code means for a computer to execute a first step of quantifying, using a testing photomask having a test pattern, the size variation in the test pattern as a function of distance and in relation to the open area ratio;
- program code means for a computer to execute a second step of dividing an exposure area having the plural actual device patterns into a plurality of correction areas and calculating effective said open area ratio of the respective correction areas; and
- program code means for a computer to execute a third step of inputting the calculated open area ratio into a result of the quantification, calculating the size variations of the actual device patterns in the respective correction areas, and correcting design data of the actual device patterns based on the size variation calculation.

36. A computer-readable recording medium recording a computer program product, the computer program product comprising:

- program code means for a computer to execute a first step of dividing an exposure area having a plurality of actual device patterns into a plurality of correction areas and calculating an effective open area ratio of light transmitting areas of the respective correction areas; and
- program code means for a computer to execute a second step of calculating, using the calculated open area ratio, size variations occurring in the actual device patterns in the respective correction areas and correcting design data of the actual device patterns based on the size variation calculation;
- wherein an open area ratio is a ratio of light transmitting areas in an area within a set distance in a prescribed place.

* * * * *